US010727186B2

(12) United States Patent
Soda et al.

(10) Patent No.: US 10,727,186 B2
(45) Date of Patent: Jul. 28, 2020

(54) POWER SEMICONDUCTOR DEVICE

(71) Applicant: Mitsubishi Electric Corporation, Chiyoda-ku (JP)

(72) Inventors: Shinnosuke Soda, Chiyoda-ku (JP); Yoshinori Yokoyama, Chiyoda-ku (JP); Hiroshi Kobayashi, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 16/315,050

(22) PCT Filed: Jul. 6, 2017

(86) PCT No.: PCT/JP2017/024840
§ 371 (c)(1),
(2) Date: Jan. 3, 2019

(87) PCT Pub. No.: WO2018/025571
PCT Pub. Date: Feb. 8, 2018

(65) Prior Publication Data
US 2019/0279943 A1    Sep. 12, 2019

(30) Foreign Application Priority Data
Aug. 5, 2016    (JP) .................................. 2016-154316

(51) Int. Cl.
*H01L 23/00* (2006.01)
*H01L 23/50* (2006.01)
(Continued)

(52) U.S. Cl.
CPC ............ *H01L 23/562* (2013.01); *H01L 21/52* (2013.01); *H01L 23/3735* (2013.01);
(Continued)

(58) Field of Classification Search
CPC . H01L 2224/48227; H01L 2224/48247; H01L 23/49534; H01L 24/32; H01L 23/562
See application file for complete search history.

(56) References Cited

U.S. PATENT DOCUMENTS 8,815,648 B1 *    8/2014  Aoya ...................... H01L 24/85
                                                          438/112
2002/0121680 A1 *  9/2002  Ahn ..................... H01L 21/6835
                                                          257/666

(Continued)

FOREIGN PATENT DOCUMENTS

JP    2005-19694 A    1/2005
JP    2010-10502 A    1/2010
(Continued)

OTHER PUBLICATIONS

International Search Report dated Sep. 26, 2017 in PCT/JP2017/024840 filed Jul. 6, 2017.
(Continued)

*Primary Examiner* — Matthew L Reames
*Assistant Examiner* — John A Bodnar
(74) *Attorney, Agent, or Firm* — Oblon, McClelland, Maier & Neustadt, L.L.P.

(57) ABSTRACT

A power semiconductor device having a high degree of reliability even when an operable temperature of a power semiconductor element is sufficiently increased. The power semiconductor device includes: a power semiconductor element including an electrode formed on a first surface; a first stress mitigation portion connected to the electrode with a first bonding portion being interposed; and a wiring portion electrically connected to the first stress mitigation portion with a second bonding portion being interposed. A bonding strength of the first bonding portion is higher than a bonding strength of the second bonding portion.

14 Claims, 9 Drawing Sheets

(51) Int. Cl.
*H01L 23/373* (2006.01)
*H01L 21/52* (2006.01)
*H01L 25/07* (2006.01)
*H01L 23/48* (2006.01)
*H01L 25/18* (2006.01)

(52) U.S. Cl.
CPC .............. *H01L 23/48* (2013.01); *H01L 23/50* (2013.01); *H01L 25/07* (2013.01); *H01L 25/18* (2013.01); *H01L 2224/33* (2013.01)

(56) References Cited

U.S. PATENT DOCUMENTS

| | | | | |
|---|---|---|---|---|
| 2006/0138532 | A1* | 6/2006 | Okamoto | H01L 23/051 257/328 |
| 2012/0114972 | A1* | 5/2012 | Komatsu | B22F 1/0018 428/673 |
| 2012/0152510 | A1* | 6/2012 | Noda | B23K 1/0016 165/185 |
| 2014/0048918 | A1* | 2/2014 | Nagaune | H01L 23/4334 257/675 |
| 2015/0008570 | A1* | 1/2015 | Arai | H01L 23/24 257/687 |
| 2015/0035137 | A1* | 2/2015 | Nishimoto | B23K 35/3006 257/712 |
| 2015/0294920 | A1* | 10/2015 | Asai | H01L 24/33 257/666 |

FOREIGN PATENT DOCUMENTS

| | | |
|---|---|---|
| JP | 2015-23183 | 2/2015 |
| JP | 2015-93295 | 5/2015 |
| JP | 2016-111083 | 6/2016 |
| WO | WO 2012/157584 A1 | 11/2012 |

OTHER PUBLICATIONS

Japanese Office Action dated Feb. 25, 2020 in Japanese Application No. 2018-531792 (with Computer Generated English Translation).
Japanese Office Action dated Jun. 2, 2020 in Japanese Application No. 2018-551792, with English translation, 12 pages.

* cited by examiner

POWER SEMICONDUCTOR DEVICE

TECHNICAL FIELD

The present invention relates to a power semiconductor device, and particularly to a power semiconductor device including a power semiconductor element operated at high temperature.

BACKGROUND ART

In power electronics equipment such as inverters for electric vehicles and hybrid vehicles and inverters for railway vehicles, a reduction in size and cost of a power semiconductor device (power module) which is a core component is demanded. One method for achieving the reduction in size and cost is to increase an operable temperature of a power semiconductor element.

When the operable temperature of the power semiconductor element is increased, a current value per unit area that can be input into the element increases. As a result, the power semiconductor element and the power semiconductor device can be reduced in size, and with the reduction in size, the manufacturing cost of the power semiconductor device can be reduced.

On the other hand, when the operable temperature of the power semiconductor element is increased, a thermal stress generated in the power semiconductor device due to a difference in thermal expansion coefficient between the power semiconductor element and a wiring portion increases. As a result, the thermal stress concentrates on a connecting portion (on-chip bonding portion) that connects the power semiconductor element and the wiring portion, which leads to deterioration in thermal fatigue durability of the connecting portion.

As the technique for increasing the thermal fatigue durability of such an on-chip bonding portion, the following technique is known, for example.

Japanese Patent Laying-Open No. 2010-10502 discloses a semiconductor module in which an electrode of a power semiconductor element and a wiring portion are bonded by a silver (Ag)-based bonding layer.

Japanese Patent Laying-Open No. 2005-19694 discloses a power module in which a stacked body is inserted between an electrode portion of a chip and a terminal portion (wiring portion). The stacked body is formed of two low deformation resistive elements acting as stress buffering members, and a low thermal expansion element disposed between the two low deformation resistive elements and having a thermal expansion coefficient lower than a thermal expansion coefficient of the low deformation resistive elements. The electrode portion and one low deformation resistive element of the stacked body are bonded with an intermetallic compound layer mainly composed of Sn and Ni being interposed, and the other low deformation resistive element of the stacked body and the terminal portion are also bonded with an intermetallic compound layer mainly composed of Sn and Ni being interposed. The intermetallic compound layers have an equivalent configuration.

CITATION LIST

Patent Literature

PTL 1: Japanese Patent Laying-Open No. 2010-10502
PTL 2: Japanese Patent Laying-Open No. 2005-19694

SUMMARY OF INVENTION

Technical Problem

However, the thermal fatigue durability of conventional power semiconductor devices is insufficient, depending on the operation temperature of a power semiconductor element. Therefore, conventional power semiconductor devices do not have a high degree of reliability. According to the semiconductor module described in Japanese Patent Laying-Open No. 2010-10502, when the operable temperature of the power semiconductor element is sufficiently increased from the perspective of the above-described reduction in size, the electrode of the power semiconductor element is likely to be damaged. According to the power module described in Japanese Patent Laying-Open No. 2005-19694, when the operable temperature of the power semiconductor element is sufficiently increased from the perspective of the above-described reduction in size, the intermetallic compound layer that bonds the electrode portion to the stacked body or the electrode portion is likely to be damaged.

The present invention has been made to solve the above-described problems. A main object of the present invention is to provide a power semiconductor device having a high degree of reliability even when an operable temperature of a power semiconductor element is sufficiently increased.

Solution to Problem

A power semiconductor device according to the present invention includes: a power semiconductor element having a first surface and including an electrode formed on the first surface; a first stress mitigation portion connected to the electrode with a first bonding portion being interposed; and a wiring portion electrically connected to the first stress mitigation portion with a second bonding portion being interposed. A bonding strength of the first bonding portion is higher than a bonding strength of the second bonding portion.

Advantageous Effects of Invention

According to the present invention, there can be provided a power semiconductor device having a high degree of reliability even when an operable temperature of a power semiconductor element is sufficiently increased.

DESCRIPTION OF EMBODIMENTS

Figure 1:
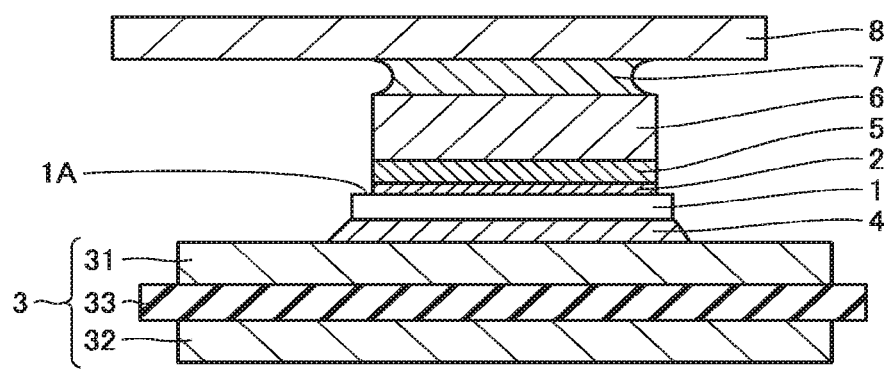
FIG. 1 is a cross-sectional view showing a power semiconductor device according to a first embodiment.

Embodiments of the present invention will be described hereinafter with reference to the drawings. In the following drawings, the same or corresponding portions are denoted by the same reference numerals and description thereof will not be repeated.

First Embodiment

<Configuration of Power Semiconductor Device>

Referring to FIG. 1, a power semiconductor device 100 according to a first embodiment mainly includes a power semiconductor element 1, an insulating substrate 3, a sintered metal layer 5 serving as a first bonding portion, a stress mitigation portion 6, a solder layer 7 serving as a second bonding portion, and a bus bar 8.

Power semiconductor element 1 may be an arbitrary power semiconductor element, and is, for example, an IGBT (Insulated Gate Bipolar Transistor). Power semiconductor element 1 has a first surface 1A and a surface located on the opposite side of first surface 1A. An electrode 2 is formed on first surface 1A of power semiconductor element 1. Electrode 2 is formed on a part of first surface 1A. The surface located on the opposite side of first surface 1A of power semiconductor element 1 is bonded to insulating substrate 3 with a die bonding material 4 being interposed, for example. Power semiconductor element 1 can operate at high temperature. An operation limit temperature of power semiconductor element 1 is, for example, not lower than 175° C., and preferably not lower than 200° C.

A material for electrode 2 may be an arbitrary material having electrical conductivity, and includes, for example, at least one of aluminum (Al), nickel (Ni), copper (Cu), and gold (Au). Electrode 2 may have an arbitrary planar shape when first surface 1A is seen in a plan view, and has, for example, a rectangular planar shape. Electrode 2 is formed, for example, as a stacked body of a first layer in contact with first surface 1A, a second layer formed on the first layer, and a third layer formed on the second layer. Alternatively, electrode 2 may be formed as a single layer, not as the stacked body. In this case, the material for electrode 2 is, for example, Cu. Such electrode 2 can be formed by electrolytic plating in which a Cu thin film formed on first surface 1A of power semiconductor element 1 is used as a seed layer.

A material for the first layer of electrode 2 includes, for example, Al, and may be pure aluminum or an aluminum alloy. In addition to Al, the material for the first layer may include at least one selected from the group consisting of silicon (Si), copper (Cu), manganese (Mn), magnesium (Mg), zinc (Zn), and nickel (Ni). When the first layer is made of an aluminum alloy, the strength of the first layer increases, and thus, damage to electrode 2 can be suppressed even during operation at high temperature. A thickness of the above-described first layer is, for example, 5 μm.

A material for the second layer of electrode 2 includes, for example, Ni. The second layer can be formed, for example, by electroless plating. In this case, a phosphorus (P)-concentrated layer can be formed in the second layer. In addition, the manufacturing cost of power semiconductor device 100 can be reduced. The second layer can be formed, for example, by electrolytic plating. In this case, formation of the phosphorus (P)-concentrated layer in the second layer is suppressed. A thickness of the above-described second layer is, for example, not less than 1 μm and not more than 10 μm. There is a tendency that damage to the first layer is further suppressed as the second layer becomes thicker. However, when the second layer is too thick, an abnormality such as separation of electrode 2 or warpage of power semiconductor element 1 is likely to occur due to a film stress generated in the second layer. Therefore, the thickness of the above-described second layer including Ni as a constituent material is preferably not more than 10 μm. More preferably, the thickness of the above-described second layer is, for example, not less than 3 μm and not more than 7 μm.

Alternatively, the material for the second layer of electrode 2 includes, for example, Cu. Such second layer can be formed, for example, by electroless plating. The thickness of the second layer including Cu as a constituent material is preferably not more than 30 μm. More preferably, the thickness of the above-described second layer is, for example, not less than 3 μm and not more than 10 μm.

A material for the third layer of electrode 2 includes, for example, Au. The third layer can be formed, for example, by flash plating. A thickness of the above-described third layer is, for example, not less than 0.01 μm and not more than 1 μm, and more preferably not less than 0.05 μm and not more than 0.5 μm. The thickness of the above-described third layer is, for example, 0.1 μm.

The third layer does not have to be formed. When bonding between the second layer of electrode 2 and sintered metal layer 5 serving as a first bonding portion described below is maintained even during operation at high temperature and the reliability of power semiconductor device 100 is ensured, the third layer does not have to be formed.

The material for the third layer may include, for example, Cu. In this case, the third layer can be formed, for example, by plating in which a Cu thin film formed on the second layer is used as a seed layer. The thickness of the third layer in this case is, for example, not less than 1 μm and not more than 30 μm. With such a configuration, damage to electrode 2 can be suppressed. A film stress of the third layer made of Cu is smaller than the film stress of the second layer made of Ni, and thus, the thickness of the third layer can be made greater than the thickness of the second layer.

Insulating substrate 3 is configured by stacking a first conductor 31 and a second conductor 32 with an insulating ceramics plate 33 being interposed. First conductor 31 has power semiconductor element 1 mounted thereon. A surface (entire surface) of first conductor 31 located on the opposite side of a surface bonded to power semiconductor element 1 is bonded to insulating ceramics plate 33. A surface of insulating ceramics plate 33 located on the opposite side of a surface bonded to first conductor 31 is bonded to second conductor 32. A material for first conductor 31 and second conductor 32 may be an arbitrary material having electrical conductivity and having a high thermal conductivity, and is, for example, copper (Cu) or aluminum (Al). A material for insulating ceramics plate 33 may be an arbitrary material having an electrical insulating property and having a high thermal conductivity, and is, for example, a material including at least one of silicon nitride (SiN), aluminum nitride (AlN) and alumina ($Al_2O_3$).

Die bonding material 4 may be an arbitrary material that can bond power semiconductor element 1 to first conductor 31, and is, for example, solder, low-temperature sintered material including silver nanoparticles, or the like.

Sintered metal layer 5 electrically connects electrode 2 of power semiconductor element 1 and stress mitigation portion 6. Sintered metal layer 5 is, for example, bonded to the above-described second layer or the above-described third layer of electrode 2, and is bonded to stress mitigation portion 6. Sintered metal layer 5 is formed such that an outline of sintered metal layer 5 overlaps with an outline of electrode 2 when above-described first surface 1A is seen in a plan view. Sintered metal layer 5 is, for example, bonded to an entire upper surface (surface located on the opposite side of a surface in contact with first surface 1A) of electrode 2. Sintered metal layer 5 may have an arbitrary planar shape when first surface 1A is seen in a plan view, and has, for example, a rectangular planar shape.

A material for sintered metal layer 5 is a sintered metal. The material for sintered metal layer 5 includes, for example, at least one of silver (Ag) and Cu. From a different perspective, the material for sintered metal layer 5 includes a material other than the material for electrode 2 and the material for stress mitigation portion 6. Sintered metal layer 5 is, for example, a sintered member obtained by heating and pressurizing a paste-like kneaded material in which a metal powder such as Ag or Cu is dispersed in a resin. The metal powder has a particle size of, for example, not less than several nanometers and not more than several micrometers. The above-described paste-like kneaded material can be applied onto electrode 2 by, for example, a printing method with a dispenser. Alternatively, sintered metal layer 5 may be a sintered member obtained by pressurizing and heating the above-described kneaded material shaped into a sheet preliminarily. When the paste-like kneaded material is applied using the dispenser, it is concerned that the kneaded material spreads beyond a prescribed region due to, for example, variations in amount of application by the dispenser, and thus, a metal residue is formed on power semiconductor element 1. In contrast, as compared with sintered metal layer 5 formed using the above-described kneaded material applied by the dispenser, the variations in amount of the above-described kneaded material are suppressed and thus the formation of the above-described metal residue can be suppressed in sintered metal layer 5 formed using the sheet-like material obtained by shaping the above-described kneaded material.

When sintered metal layer 5 is heated to an operation temperature range during operation of power semiconductor element 1 at high temperature and a temperature range close to a melting point of solder layer 7 described below, sintered metal layer 5 is higher in hardness, shear strength and yield strength than solder layer 7. When the temperature of power semiconductor element 1 is a certain temperature within a temperature range of not lower than 175° C. and not higher than 230° C. (first temperature range), the hardness, the shear strength and the yield strength of sintered metal layer 5 is higher than the hardness, the shear strength and the yield strength of solder layer 7. When the temperature of power semiconductor element 1 is 200° C., the hardness, the shear strength and the yield strength of sintered metal layer 5 is higher than the hardness, the shear strength and the yield strength of solder layer 7.

The hardness of sintered metal layer 5 when the temperature of sintered metal layer 5 is a certain temperature within the temperature range of not lower than 175° C. and not higher than 230° C. (first temperature range) is higher than the hardness of solder layer 7 when the temperature of solder layer 7 is a certain temperature within the first temperature range. The shear strength of sintered metal layer 5 when the temperature of sintered metal layer 5 is a certain temperature within the above-described first temperature range is higher than the shear strength of solder layer 7 when the temperature of solder layer 7 is a certain temperature within the above-described first temperature range. The yield strength of sintered metal layer 5 when the temperature of sintered metal layer 5 is a certain temperature within the above-described first temperature range is higher than the yield strength of solder layer 7 when the temperature of solder layer 7 is a certain temperature within the above-described first temperature range.

Preferably, the hardness of sintered metal layer 5 when the temperature of sintered metal layer 5 is within a temperature range of not lower than room temperature and not higher than the melting point of solder layer 7 (second temperature range) is higher than the hardness of solder layer 7 when the temperature of solder layer 7 is within the second temperature range. The shear strength of sintered metal layer 5 when the temperature of sintered metal layer 5 is within the above-described second temperature range is higher than the shear strength of solder layer 7 when the temperature of solder layer 7 is within the above-described second temperature range. The yield strength of sintered metal layer 5 when the temperature of sintered metal layer 5 is within the above-described second temperature range is higher than the yield strength of solder layer 7 when the temperature of solder layer 7 is within the above-described second temperature range.

The hardness of sintered metal layer 5 and solder layer 7 is obtained, for example, by polishing power semiconductor device 100 in a direction perpendicular to first surface 1A (in a thickness direction of sintered metal layer 5) to thereby obtain an exposed cross section, and measuring the exposed cross section using a nanoindenter. The yield strength of sintered metal layer 5 and solder layer 7 is obtained, for example, by polishing power semiconductor device 100 in a direction perpendicular to first surface 1A (in a thickness direction of sintered metal layer 5) to thereby obtain an exposed cross section, and measuring the exposed cross section using a nanoindenter. The shear strength of sintered metal layer 5 and solder layer 7 is measured, for example, by a tensile shear test. For example, the shear strength of sintered metal layer 5 and solder layer 7 is measured by fixing insulating substrate 3 of power semiconductor device 100 and applying a shear load to a wiring portion 8 in a direction along first surface 1A. In the above-described measurement, insulating substrate 3 of power semiconductor device 100 is arranged on a sample stage having a temperature adjustment function, and power semiconductor element 1 is heated to a certain temperature within the above-described first temperature range by the sample stage, for example. The temperature of power semiconductor element 1 can be measured using an arbitrary thermometer.

Stress mitigation portion 6 is formed between electrode 2 of power semiconductor element 1 and bus bar 8. Stress mitigation portion 6 is connected to electrode 2 with sintered metal layer 5 being interposed. A thermal expansion coefficient of stress mitigation portion 6 is not lower than a thermal expansion coefficient of power semiconductor element 1 and not higher than a thermal expansion coefficient of bus bar 8, and preferably higher than the thermal expansion coefficient of power semiconductor element 1 and lower than the thermal expansion coefficient of bus bar 8. For example, when power semiconductor element 1 is mainly made of Si (thermal expansion coefficient $\alpha$=2 ppm/K) and bus bar 8 is made of Cu (thermal expansion coefficient $\alpha$=17 ppm/K), thermal expansion coefficient $\alpha$ of stress mitigation portion 6 is, for example, 11 ppm/K.

Figure 17:
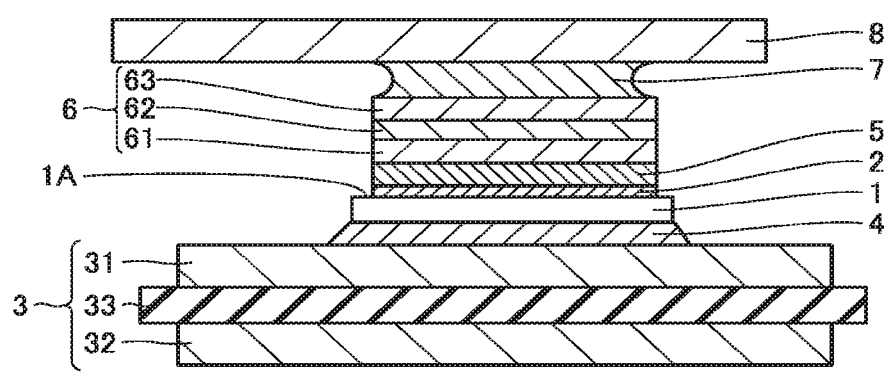
FIG. 17 is a cross-sectional view showing a modification of the power semiconductor device according to the first embodiment.

Such stress mitigation portion 6 is configured, for example, as a stacked body (first Cu layer/invar/second Cu layer) formed of invar, a first Cu layer formed on one side of the invar, and a second Cu layer formed to sandwich the invar between the first Cu layer and the second Cu layer (see FIG. 17). In this case, a thickness of the first Cu layer in a stacking direction is, for example, equal to a thickness of the invar in the stacking direction and a thickness of the second Cu layer in the stacking direction. A material for stress mitigation portion 6 includes, for example, at least one selected from the group consisting of Cu, Al, Ag, Ni, and Cu. Stress mitigation portion 6 may be made of, for example, a Cu alloy or an Al alloy. Stress mitigation portion 6 may be configured, for example, as a cladding material of Cu and invar including iron (Fe) and Ni. Stress mitigation portion 6 is formed such that an outline of stress mitigation portion 6 overlaps with an outline of electrode 2 and an outline of sintered metal layer 5 when above-described first surface 1A is seen in a plan view. Stress mitigation portion 6 is, for example, bonded to an entire upper surface (surface located on the opposite side of a surface in contact with electrode 2) of sintered metal layer 5. Stress mitigation portion 6 may have an arbitrary planar shape when first surface 1A is seen in a plan view, and has, for example, a rectangular planar shape.

Solder layer 7 electrically connects stress mitigation portion 6 and bus bar 8. A material for solder layer 7 includes Sn, and further includes, for example, Ag and Cu.

Bus bar 8 is electrically connected to electrode 2 of power semiconductor element 1 with sintered metal layer 5, stress mitigation portion 6 and solder layer 7 being interposed. Bus bar 8 has a first region that overlaps with solder layer 7 when first surface 1A is seen in a plan view, and a second region that does not overlap with solder layer 7 when first surface 1A is seen in a plan view. A material for bus bar 8 includes, for example, at least one of Cu and Al. Bus bar 8 may be made of, for example, a Cu alloy or an Al alloy. Bus bar 8 may be configured, for example, as a cladding material of Cu and invar including iron (Fe) and Ni. When bus bar 8 is configured as the cladding material, the thermal expansion coefficient of bus bar 8 can be adjusted by adjusting thicknesses of Cu and invar, and thus, damage to solder layer 7 can be suppressed. Preferably, the above-described first region that overlaps with solder layer 7 when above-described first surface 1A is seen in a plan view is configured as the above-described cladding material, and the above-described second region that does not overlap with solder layer 7 when above-described first surface 1A is seen in a plan view is made of at least one of Cu and Al. With such a configuration, a rated current density of bus bar 8 can be increased, as compared with the case in which bus bar 8 as a whole is formed by the cladding material including invar.

<Method for Manufacturing Power Semiconductor Device 100>

A method for manufacturing power semiconductor device 100 includes, for example, the steps of preparing power semiconductor element 1 including electrode 2, insulating substrate 3, stress mitigation portion 6, and bus bar 8; bonding electrode 2 to stress mitigation portion 6 with sintered metal layer 5 being interposed (first bonding step); bonding stress mitigation portion 6 to bus bar 8 with solder layer 7 being interposed (second bonding step); and bonding power semiconductor element 1 to insulating substrate 3 with die bonding material 4 being interposed (third bonding step). In the first bonding step, in a state where electrode 2 and stress mitigation portion 6 are stacked with the above-described kneaded material being interposed, the kneaded material is pressurized and heated, and thus, sintered. In this way, power semiconductor device 100 is manufactured.

<Function and Effect of Power Semiconductor Device 100>

Power semiconductor device 100 includes power semiconductor element 1 having first surface 1A and including electrode 2 formed on first surface 1A, stress mitigation portion 6 connected to electrode 2 with sintered metal layer 5 as a first bonding portion being interposed, and bus bar 8 as a wiring portion electrically connected to stress mitigation portion 6 with solder layer 7 as a second bonding portion being interposed. When the temperature of power semiconductor element 1 is at least one temperature (e.g., 200° C.) within the temperature range of not lower than 175° C. and not higher than 230° C., at least one of the hardness, the shear strength and the yield strength of sintered metal layer 5 is higher than at least one of the hardness, the shear strength and the yield strength of solder layer 7.

During operation of power semiconductor element 1 at high temperature, a thermal stress applied to sintered metal layer 5 is greater than a thermal stress applied to solder layer 7. When the temperature of power semiconductor element 1 is at least one temperature within the temperature range of not lower than 175° C. and not higher than 230° C., i.e., during operation of power semiconductor element 1 at high temperature, sintered metal layer 5 is higher in hardness, shear strength and yield strength than solder layer 7. That is, according to power semiconductor device 100, the thermal stress greater than the thermal stress applied to solder layer 7 can be applied to sintered metal layer 5 that is robuster than solder layer 7. As a result, as compared with a conventional power semiconductor device in which a bonding portion between an electrode of a power semiconductor element and a stress mitigation portion is formed by solder bonding similarly to a bonding portion between the stress mitigation portion and a wiring portion, power semiconductor device 100 has a higher degree of thermal fatigue durability, and thus, damage to sintered metal layer 5 and solder layer 7 is suppressed even during operation at high temperature. Therefore, power semiconductor device 100 has a higher degree of reliability than that of the conventional power semiconductor device.

During operation of power semiconductor device 100, the temperature of power semiconductor element 1 is higher than the temperature of sintered metal layer 5 and the temperature of solder layer 7. Therefore, if the hardness, the shear strength and the yield strength of sintered metal layer 5 when the temperature of sintered metal layer 5 is within the above-described second temperature range is higher than the hardness, the shear strength and the yield strength of solder layer 7 when the temperature of solder layer 7 is within the second temperature range, for example, a value of the first bonding portion is higher than a value of the second bonding portion as to the hardness, the shear strength and the yield strength when the temperature of power semiconductor element 1 is not lower than 175° C. and not higher than 230° C.

In addition, as compared with a conventional power semiconductor device in which an electrode of a power semiconductor element is bonded to a wiring portion only by a sintered Ag layer, power semiconductor device 100 can prevent concentration of the thermal stress on electrode 2, and thus, damage to electrode 2 can be suppressed. As a result, power semiconductor device 100 has a higher degree of reliability than that of the conventional power semiconductor device.

In above-described power semiconductor device 100, the material for electrode 2 preferably includes Cu. Electrode 2 preferably includes a Cu-plated layer. With such a configuration, the film stress of electrode 2 is smaller, as compared with the case in which the material for electrode 2 includes Ni but does not include Cu, and thus, electrode 2 is less likely to be damaged even during operation at high temperature. As a result, power semiconductor device 100 has a higher degree of reliability than that of the above-described conventional power semiconductor device.

In above-described power semiconductor device 100, the second bonding portion is solder layer 7. Solder layer 7 can absorb variations in position of stress mitigation portion 6 relative to power semiconductor element 1 (position in the direction along first surface 1A and in the direction perpendicular to first surface 1A). Therefore, the productivity of power semiconductor device 100 is equal to the productivity of the conventional power semiconductor device.

The thermal expansion coefficient of stress mitigation portion 6 can be adjusted in accordance with the degree of damage to each of electrode 2, sintered metal layer 5 serving as a first bonding portion, and solder layer 7 serving as a second bonding portion during operation of power semiconductor element 1 at high temperature. When electrode 2 or sintered metal layer 5 is greatly damaged during operation of power semiconductor element 1 at high temperature, the thermal expansion coefficient of stress mitigation portion 6 is preferably brought closer to the thermal expansion coefficient of power semiconductor element 1. When solder layer 7 is greatly damaged during operation of power semiconductor element 1 at high temperature, the thermal expansion coefficient of stress mitigation portion 6 is preferably brought closer to the thermal expansion coefficient of bus bar 8.

Second Embodiment

Next, a power semiconductor device according to a second embodiment will be described. The power semiconductor device according to the second embodiment is configured basically similarly to power semiconductor device 100 according to the first embodiment. However, the power semiconductor device according to the second embodiment is different from power semiconductor device 100 according to the first embodiment in that the second bonding portion is a second sintered metal layer, instead of solder layer 7.

The first bonding portion that bonds electrode 2 to stress mitigation portion 6 is a first sintered metal layer having a configuration equivalent to that of sintered metal layer 5 in power semiconductor device 100. That is, the first sintered metal layer is a sintered member obtained, for example, by heating and pressurizing a paste-like kneaded material in which a metal powder such as Ag or Cu is dispersed. The second sintered metal layer is a sintered member obtained, for example, by heating, without pressurizing, a paste-like kneaded material in which a metal powder such as Ag or Cu is dispersed. A porosity of the first sintered metal layer is lower than a porosity of the second sintered metal layer. That is, a sintered density of the first sintered metal layer is higher than a sintered density of the second sintered metal layer.

Within the temperature range of not lower than 175° C. and not higher than 230° C., i.e., during operation of power semiconductor element 1 at high temperature, the first sintered metal layer is higher in hardness, shear strength and yield strength than the second sintered metal layer. As a result, the power semiconductor device according to the second embodiment can produce an effect similar to that of power semiconductor device 100 according to the first embodiment.

The second sintered metal layer is formed by sintering the above-described kneaded material without pressurizing. That is, instead of the above-described second bonding step in the above-described method for manufacturing power semiconductor device 100, in a method for manufacturing the power semiconductor device according to the second embodiment, the above-described kneaded material is heated and sintered without being pressurized, in a state where stress mitigation portion 6 and bus bar 8 are stacked with the kneaded material being interposed. Therefore, the productivity of the power semiconductor device according to the second embodiment is equal to the productivity of power semiconductor device 100 and the conventional power semiconductor device.

Third Embodiment

Next, a power semiconductor device according to a third embodiment will be described. The power semiconductor device according to the third embodiment is configured basically similarly to power semiconductor device 100 according to the first embodiment. However, the power semiconductor device according to the third embodiment is different from power semiconductor device 100 according to the first embodiment in that the first bonding portion is a liquid phase diffusion bonding layer, instead of sintered metal layer 5.

The liquid phase diffusion bonding layer is a layer formed by liquid phase diffusion bonding. Specifically, a bonding member made of a material having a melting point lower than the melting points of the materials for electrode 2 and stress mitigation portion 6 which are the members to be bonded is first prepared. The material for the bonding member includes, for example, Sn. Next, electrode 2 and stress mitigation portion 6 are stacked with the bonding member being interposed. The bonding member is applied onto electrode 2 by, for example, a reflow method. Next, the bonding member is heated to a temperature that is lower than the melting points of the materials for electrode 2 and stress mitigation portion 6 and not lower than the melting point of the material for the bonding member. As a result, only the bonding member is melted to form a liquid phase. The temperature of the bonding member is kept until the liquid-phase bonding member is isothermally solidified. As a result, the liquid phase diffusion bonding layer that bonds electrode 2 to stress mitigation portion 6 is formed. The liquid phase diffusion bonding layer includes, for example, $Cu_3Sn$ obtained by alloying Sn in the bonding member and Cu in electrode 2 or stress mitigation portion 6, and $Ni_3Sn_4$ obtained by alloying Sn in the bonding member and Ni in electrode 2 or stress mitigation portion 6.

Within the temperature range of not lower than 175° C. and not higher than 230° C., the above-described liquid phase diffusion bonding layer is higher in hardness, shear strength and yield strength than solder layer 7 formed by solder bonding. As a result, the power semiconductor device according to the third embodiment can produce an effect similar to that of power semiconductor device 100 according to the first embodiment.

In addition, the occurrence of a void is suppressed and the occurrence of a residual stress is suppressed in the above-described liquid phase diffusion bonding layer, as compared with sintered metal layer 5 in power semiconductor device 100, and thus, the above-described liquid phase diffusion bonding layer has a high degree of thermal fatigue durability. As a result, the power semiconductor device according to the third embodiment has a higher degree of reliability than that of power semiconductor device 100.

In the power semiconductor device according to the third embodiment, the second bonding portion may be the liquid phase diffusion bonding layer. Such second bonding portion can be formed without being pressurized, similarly to solder layer 7 in power semiconductor device 100 and the second sintered metal layer in the power semiconductor device according to the second embodiment. Therefore, the productivity of the power semiconductor device according to the third embodiment is equal to the productivity of power semiconductor device 100 and the conventional power semiconductor device.

Fourth Embodiment

Figure 2:
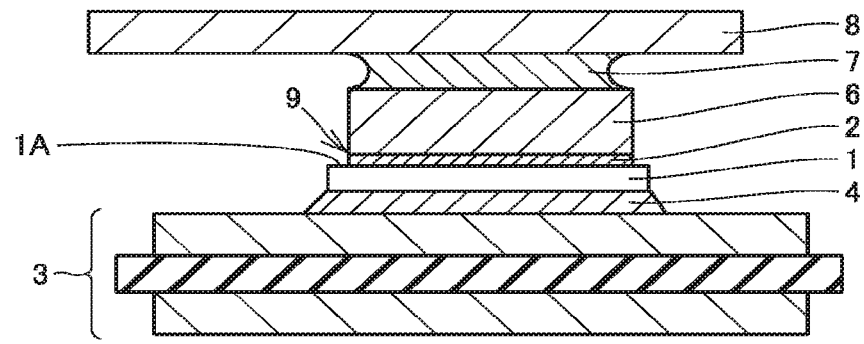
FIG. 2 is a cross-sectional view showing a power semiconductor device according to a fourth embodiment.

Next, a power semiconductor device 101 according to a fourth embodiment will be described with reference to FIG. 2. Power semiconductor device 101 according to the fourth embodiment is configured basically similarly to power semiconductor device 100 according to the first embodiment. However, power semiconductor device 101 according to the fourth embodiment is different from power semiconductor device 100 according to the first embodiment in that the first bonding portion is an interface 9 at which electrode 2 is directly bonded to stress mitigation portion 6.

That is, in power semiconductor device 101, interface 9 is higher in shear strength than solder layer 7 when interface 9 is heated to an operation temperature range during operation of power semiconductor element 1 at high temperature and a temperature range close to the melting point of solder layer 7 described below. At interface 9, atoms or molecules forming electrode 2 and atoms or molecules forming stress mitigation portion 6 are directly bonded (e.g., covalently bonded). Such interface 9 can be formed by a known direct bonding method. For example, interface 9 is formed by cleaning a surface of electrode 2 to be bonded to stress mitigation portion 6 and a surface of stress mitigation portion 6 to be bonded to electrode 2, and then, bringing these surfaces into direct contact with each other.

With such a configuration, the shear strength of interface 9 is higher than the shear strength of solder layer 7 within the above-described temperature range. Therefore, power semiconductor device 101 can produce an effect similar to that of power semiconductor device 100.

Using, for example, a tensile shear test performed on power semiconductor device 101, it can be checked whether the shear strength of interface 9 is higher or lower than the shear strength of solder layer 7.

In addition, in power semiconductor device 101, electrode 2 is directly bonded to stress mitigation portion 6 having a heat capacity higher than those of the other members, and thus, the occurrence of a void at interface 9 is suppressed. Therefore, power semiconductor device 101 has an improved short circuit capacity, as compared with power semiconductor device 100 in which electrode 2 and stress mitigation portion 6 are connected with sintered metal layer 5 having a void therein being interposed.

Fifth Embodiment

Figure 3:
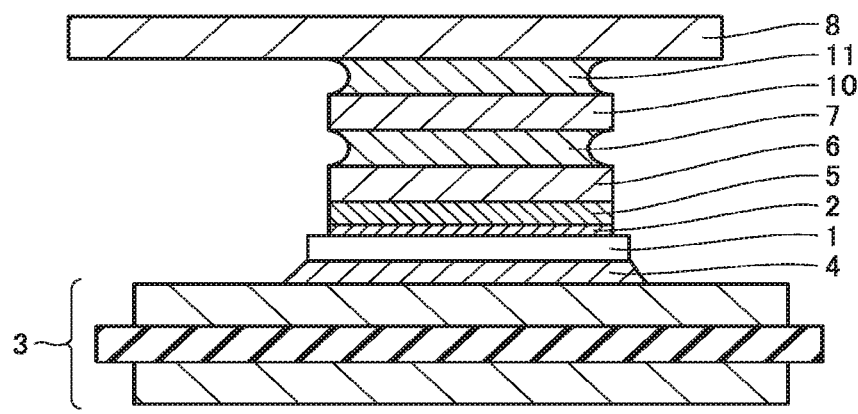
FIG. 3 is a cross-sectional view showing a power semiconductor device according to a fifth embodiment.

Next, a power semiconductor device 102 according to a fifth embodiment will be described with reference to FIG. 3. Power semiconductor device 102 according to the fifth embodiment is configured basically similarly to power semiconductor device 100 according to the first embodiment. However, power semiconductor device 102 according to the fifth embodiment is different from power semiconductor device 100 according to the first embodiment in that power semiconductor device 102 further includes a second stress mitigation portion 10 in addition to stress mitigation portion 6 (first stress mitigation portion).

Second stress mitigation portion 10 is connected to first stress mitigation portion 6 with solder layer 7 as a second bonding portion being interposed. Second stress mitigation portion 10 is connected to bus bar 8 with a solder layer 11 as a third bonding portion being interposed. Bus bar 8 is electrically connected to electrode 2 with sintered metal layer 5, first stress mitigation portion 6, solder layer 7, second stress mitigation portion 10, and solder layer 11 being interposed.

A thermal expansion coefficient of second stress mitigation portion 10 is not lower than a thermal expansion coefficient of first stress mitigation portion 6 and not higher than a thermal expansion coefficient of bus bar 8, and preferably higher than the thermal expansion coefficient of first stress mitigation portion 6 and lower than the thermal expansion coefficient of bus bar 8. As described above, the thermal expansion coefficient of first stress mitigation portion 6 is preferably higher than the thermal expansion coefficient of power semiconductor element 1 and lower than the thermal expansion coefficient of bus bar 8. For example, when power semiconductor element 1 is mainly made of Si (thermal expansion coefficient α=2 ppm/K) and bus bar 8 is made of Cu (thermal expansion coefficient α=17 ppm/K), thermal expansion coefficient α of first stress mitigation portion 6 is, for example, 8 ppm/K and thermal expansion coefficient α of second stress mitigation portion 10 is, for example, 12 ppm/K.

First stress mitigation portion 6 having the above-described thermal expansion coefficient is configured, for example, as a stacked body (first Cu layer/invar/second Cu layer) formed of invar, a first Cu layer formed on one side of the invar, and a second Cu layer formed to sandwich the invar between the first Cu layer and the second Cu layer. In this case, a thickness of the first Cu layer in a stacking direction is, for example, equal to a thickness of the second Cu layer in the stacking direction. In addition, a thickness of the invar in the stacking direction is, for example, equal to a sum of the thickness of the first Cu layer in the stacking direction and the thickness of the second Cu layer in the stacking direction. A ratio among the above-described thickness of the first Cu layer, the above-described thickness of the invar, and the above-described thickness of the second Cu layer is, for example, 1:2:1.

In addition, second stress mitigation portion 10 having the above-described thermal expansion coefficient is configured, for example, as a stacked body (third Cu layer/invar/fourth Cu layer) formed of a so-called 42 alloy (alloy including Ni and Fe as constituent materials), a third Cu layer formed on one side of the 42 alloy, and a fourth Cu layer formed to sandwich the 42 alloy between the third Cu layer and the fourth Cu layer.

A thermal stress applied to sintered metal layer 5 and solder layer 7 in such power semiconductor device 102 can be made smaller than the thermal stress applied to sintered metal layer 5 and solder layer 7 in power semiconductor device 100. Therefore, power semiconductor device 102 has an even higher degree of reliability than that of power semiconductor device 100.

In power semiconductor device 102, the first bonding portion may be the liquid phase diffusion bonding layer, and the second bonding portion may be the second sintered metal layer or the liquid phase diffusion bonding layer.

Sixth Embodiment

Figure 4:
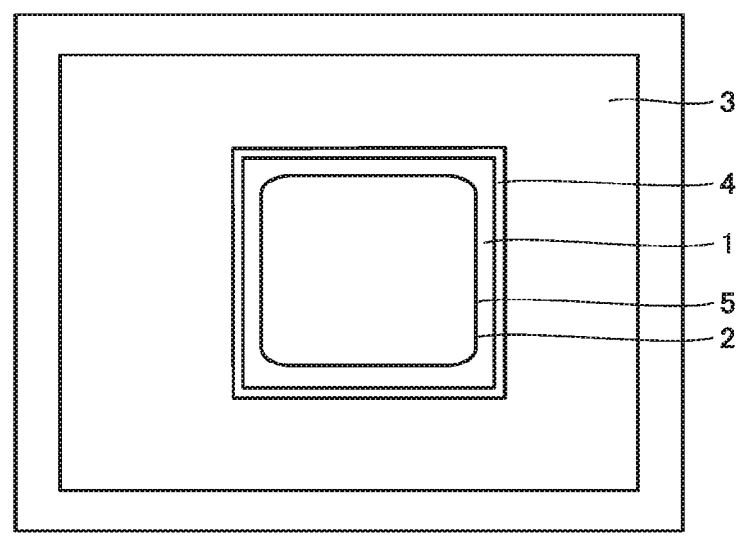
FIG. 4 is a plan view for illustrating an electrode and a first bonding portion of a power semiconductor device according to a sixth embodiment.

Next, a power semiconductor device 103 according to a sixth embodiment will be described with reference to FIG. 4. Power semiconductor device 103 according to the sixth embodiment is configured basically similarly to power semiconductor device 100 according to the first embodiment. However, power semiconductor device 103 according to the sixth embodiment is different from power semiconductor device 100 according to the first embodiment in that a corner of an outer shape of the first bonding portion has a curved shape when first surface 1A is seen in a plan view. FIG. 4 is a plan view showing only the members located on the power semiconductor element 1 side with respect to the first bonding portion in power semiconductor device 103.

The first bonding portion is, for example, sintered metal layer 5. Sintered metal layer 5 has, for example, a rounded rectangular planar shape when first surface 1A is seen in a plan view. All corners of the outer shape of the first bonding portion have a curved shape when first surface 1A is seen in a plan view. The outer shape of sintered metal layer 5 does not have any acute-angled corner when first surface 1A is seen in a plan view.

With such a configuration, concentration of the stress on the corners of the outer shape of sintered metal layer 5 can be prevented. Therefore, damage to sintered metal layer 5 can be suppressed during operation of power semiconductor element 1 at high temperature. As a result, power semiconductor device 103 has an even higher degree of reliability than that of power semiconductor device 100.

The first bonding portion may be the above-described liquid phase diffusion bonding layer. Alternatively, the first bonding portion may be interface 9. When the first bonding portion is interface 9, a corner of an outer shape of at least one of electrode 2 and stress mitigation portion 6 may have a curved shape when first surface 1A is seen in a plan view.

Seventh Embodiment

Figure 5:
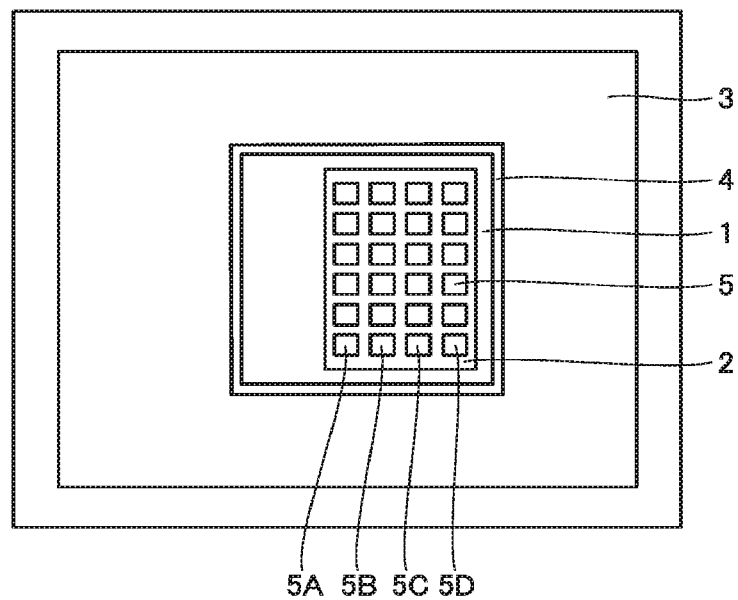
FIG. 5 is a plan view for illustrating an electrode and a first bonding portion of a power semiconductor device according to a seventh embodiment.

Next, a power semiconductor device 104 according to a seventh embodiment will be described with reference to FIG. 5. Power semiconductor device 104 according to the seventh embodiment is configured basically similarly to power semiconductor device 100 according to the first embodiment. However, power semiconductor device 104 according to the seventh embodiment is different from power semiconductor device 100 according to the first embodiment in that the first bonding portion includes a plurality of portions arranged in a dispersed manner when first surface 1A is seen in a plan view. FIG. 5 is a plan view showing only the members located on the power semiconductor element 1 side with respect to the first bonding portion in power semiconductor device 104.

The first bonding portion is, for example, sintered metal layer 5. Sintered metal layer 5 includes a plurality of portions 5A, 5B, 5C, and 5D arranged in a dispersed manner when first surface 1A is seen in a plan view. The plurality of portions 5A, 5B, 5C, and 5D are spaced apart from one another in a first direction along first surface 1A, for example. Sintered metal layer 5 further includes a plurality of portions spaced apart from the plurality of portions 5A, 5B, 5C, and 5D, respectively, in a second direction along first surface 1A and intersecting with the first direction, for example. That is, sintered metal layer 5 has the plurality of portions arranged in a dispersed manner in the first direction and in the second direction intersecting with the first direction, for example. A region of electrode 2 that is not bonded to sintered metal layer 5 has, for example, a grid-like planar shape when first surface 1A is seen in a plan view. The plurality of portions may have an arbitrary planar shape when first surface 1A is seen in a plan view, and have, for example, a rectangular planar shape.

The above-described upper surface (surface located on the opposite side of the surface in contact with first surface 1A) of electrode 2 has a region that is not bonded to sintered metal layer 5. In addition, a lower surface of stress mitigation portion 6 that faces the above-described upper surface of electrode 2 has a region that is not bonded to sintered metal layer 5.

With such a configuration, the plurality of portions of sintered metal layer 5 are arranged in a dispersed manner in the direction along first surface 1A. Therefore, even when a fracture occurs in sintered metal layer 5, for example, growth of the fracture in the direction along first surface 1A is suppressed. In addition, even when a fracture extending in the first direction occurs in sintered metal layer 5, for example, growth of the fracture in the second direction is suppressed. As a result, power semiconductor device 104 has an even higher degree of reliability than that of power semiconductor device 100.

Preferably, a corner of an outer shape of each of the plurality of portions has a curved shape when first surface 1A is seen in a plan view. Such power semiconductor device 104 can produce an effect similar to that of power semiconductor device 103. The first bonding portion may be the above-described liquid phase diffusion bonding layer.

The planar shape of the plurality of portions when first surface 1A is seen in a plan view is not limited to the rectangular shape, and may be, for example, a circular shape, or a polygonal shape in which the number of vertexes is three or more.

Although power semiconductor device 104 shown in FIG. 5 is configured such that an outer peripheral end of each of the plurality of portions of sintered metal layer 5 is bonded to a region of electrode 2 located on more inner side than an outer peripheral end of electrode 2, the present invention is not limited thereto. Power semiconductor device 104 may be formed such that a part of the outer peripheral ends of the outermost portions, of the plurality of portions of sintered metal layer 5, overlap with the outer peripheral end of electrode 2.

Eighth Embodiment

Figure 6:
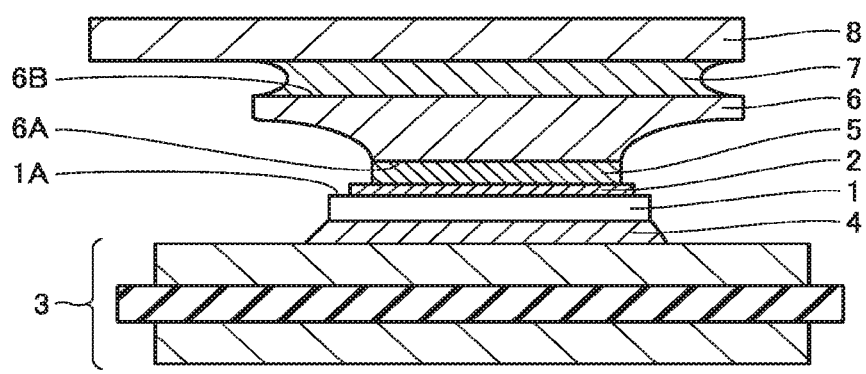
FIG. 6 is a cross-sectional view showing a power semiconductor device according to an eighth embodiment.

Next, a power semiconductor device 105 according to an eighth embodiment will be described with reference to FIG. 6. Power semiconductor device 105 according to the eighth embodiment is configured basically similarly to power semiconductor device 100 according to the first embodiment. However, power semiconductor device 105 according to the eighth embodiment is different from power semiconductor device 100 according to the first embodiment in that stress mitigation portion 6 (first stress mitigation portion) has a second surface 6A connected to the first bonding portion, and a third surface 6B located on the opposite side of second surface 6A and connected to the second bonding portion, and an area of third surface 6B is larger than an area of second surface 6A.

The first bonding portion is, for example, sintered metal layer 5. The second bonding portion is, for example, solder layer 7. Second surface 6A is connected to electrode 2 with sintered metal layer 5 being interposed. Third surface 6B is connected to bus bar 8 with solder layer 7 being interposed.

The area of second surface 6A is smaller than the area of third surface 6B. That is, the area of the entire surface (third surface 6B) of stress mitigation portion 6 bonded to solder layer 7 is larger than the area of the entire surface (second surface 6A) of stress mitigation portion 6 bonded to sintered metal layer 5.

As a result of earnest study, the inventors of the present invention have found that making the area of third surface 6B of stress mitigation portion 6 larger than the area of second surface 6A of stress mitigation portion 6 allows the thermal fatigue life (thermal fatigue durability) of the second bonding portion to increase. The inventors of the present invention have confirmed that a destruction mode caused by a crack extending from an outer peripheral end of the second bonding portion in the direction along first surface 1A when first surface 1A is seen in a plan view is dominant as a destruction mode when the second bonding portion is destructed due to thermal fatigue. Therefore, as the area of third surface 6B becomes larger, the time required for the crack occurring in the second bonding portion to grow to the extent of causing a decrease in thermal fatigue life of the second bonding portion becomes longer. As a result, power semiconductor device 105 has a higher degree of reliability than that of power semiconductor device 100 because the thermal fatigue life of the second bonding portion can be increased.

Ninth Embodiment

Figure 7:
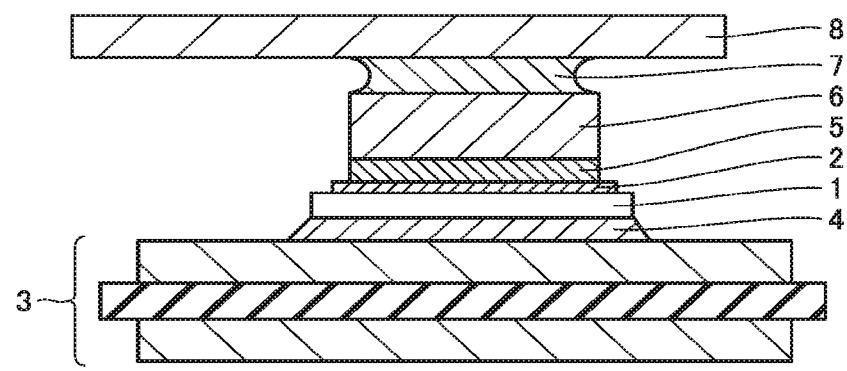
FIG. 7 is a cross-sectional view showing a power semiconductor device according to a ninth embodiment.
Figure 8:
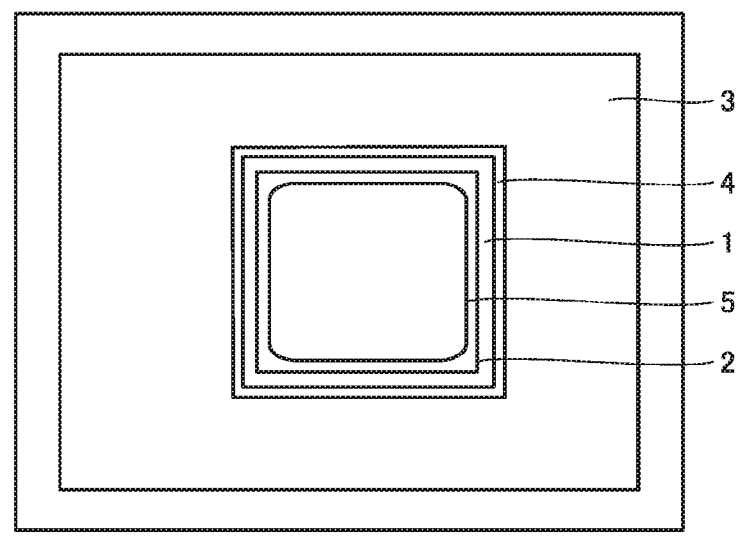
FIG. 8 is a plan view for illustrating an electrode and a first bonding portion of the power semiconductor device according to the ninth embodiment.

Next, a power semiconductor device 106 according to a ninth embodiment will be described with reference to FIGS. 7 and 8. Power semiconductor device 106 is configured basically similarly to power semiconductor device 100 according to the first embodiment. However, power semiconductor device 106 is different from power semiconductor device 100 according to the first embodiment in that an outer peripheral end of sintered metal layer 5 is bonded to a region of electrode 2 located on more inner side than an outer peripheral end of electrode 2 when first surface 1A is seen in a plan view. FIG. 8 is a plan view showing only the members located on the power semiconductor element 1 side with respect to the first bonding portion in power semiconductor device 106.

With such a configuration, concentration of a stress generated due to a difference in thermal expansion coefficient between power semiconductor element 1 and bus bar 8 on the above-described outer peripheral end of electrode 2 can be prevented even during operation of power semiconductor element 1 at high temperature. Therefore, the occurrence of damage such as separation and a crack in the above-described outer peripheral end of electrode 2 can be suppressed.

A design distance between the outer peripheral end of electrode 2 and the outer peripheral end of sintered metal layer 5 (first bonding portion) can be determined in accordance with the alignment accuracy when the above-described kneaded material that will form sintered metal layer 5 is applied (e.g., printed) onto electrode 2. For example, when the alignment accuracy is ±50 µm, the design distance between the outer peripheral end of electrode 2 and the outer peripheral end of sintered metal layer 5 (first bonding portion) is preferably 100 µm. From a perspective of suppressing the occurrence of an abnormality such as overcurrent destruction or an increase in electrical resistance caused by a decrease in bonding area of electrode 2 and sintered metal layer 5, an upper limit value of the design distance between the outer peripheral end of electrode 2 and the outer peripheral end of sintered metal layer 5 (first bonding portion) can be determined. In this case, an actual distance between electrode 2 and the outer peripheral end of sintered metal layer 5 in power semiconductor device 106 is not less than 50 µm and not more than 150 µm.

In power semiconductor device 104 according to the seventh embodiment shown in FIG. 5, the outer peripheral end of each of the plurality of portions of sintered metal layer 5 is bonded to the region of electrode 2 located on more inner side than the outer peripheral end of electrode 2.

Tenth Embodiment

Next, a power semiconductor device 107 according to a tenth embodiment will be described with reference to FIG. 9. Power semiconductor device 107 is configured basically similarly to power semiconductor device 100 according to the first embodiment. However, power semiconductor device 107 is different from power semiconductor device 100 according to the first embodiment in that a thickness of at least a part of a region of bus bar 8 in contact with the second bonding portion is smaller than a thickness of the other region.

Bus bar 8 has a thin region 8A and a thick region 8B. Thin region 8A is at least a part of a region of bus bar 8 in contact with solder layer 7 serving as a second bonding portion. Preferably, thin region 8A is provided only in the region of bus bar 8 in contact with solder layer 7. More preferably, thin region 8A is provided such that an outer shape of thin region 8A matches with an outer shape of solder layer 7 when first surface 1A is seen in a plan view. A thickness of thin region 8A is set to be smaller than the thickness of thick region 8B, and preferably not smaller than the thickness that can suppress the occurrence of an abnormality caused by an increase in electrical resistance caused by reduction in thickness or a decrease in mechanical strength. The thickness of thick region 8B is at the same level as, for example, the thickness of bus bar 8 of each of semiconductor devices 100 to 106 according to the first to ninth embodiments described above.

Above-described thin region 8A is, for example, arranged to be sandwiched between a plurality of above-described thick regions 8B in a direction of extension of bus bar 8. Above-described thin region 8A is, for example, provided to extend between opposing ends of bus bar 8 in a direction along first surface 1A and intersecting with the direction of extension of bus bar 8 (direction perpendicular to the sheet of FIG. 9).

Bus bar 8 having thin region 8A and thick region 8B is, for example, provided with a recessed portion 8C that is recessed with respect to a surface arranged to face toward the opposite side of stress mitigation portion 6. A bottom surface of recessed portion 8C is, for example, provided in parallel with a surface of bus bar 8 arranged to face toward the stress mitigation portion 6 side. A sidewall surface of recessed portion 8C is, for example, provided to connect the bottom surface of recessed portion 8C and a surface of thick region 8B arranged to face toward the opposite side of stress mitigation portion 6. The sidewall surface of recessed portion 8C is provided to be tapered to form an obtuse angle with respect to the surface of thick region 8B arranged to face toward the opposite side of stress mitigation portion 6. In this case, thin region 8A is formed of a portion having the bottom surface of recessed portion 8C, and a portion having the sidewall surface of recessed portion 8C. The portion of thin region 8A having the bottom surface of recessed portion 8C has a constant thickness. The portion of thin region 8A having the sidewall surface of recessed portion 8C is provided such that the thickness thereof becomes gradually smaller from thick region 8B toward the bottom surface side of recessed portion 8C.

A material for solder layer 7 serving as a second bonding portion is, for example, Sn—Cu-based solder including antimony (Sb) in an amount of not less than 5% and not more than 10%.

As described above, in above-described power semiconductor device 107, bus bar 8 has thin region 8A and thick region 8B, and thin region 8A is bonded to solder layer 7. Therefore, as compared with the case in which bus bar 8 as a whole is provided to be thick at the same level as thick region 8B, a thermal stress applied to solder layer 7 can be reduced and the thermal fatigue life (thermal fatigue durability) of solder layer 7 can be increased in above-described power semiconductor device 107. In addition, as compared with the case in which bus bar 8 as a whole is provided to be thin at the same level as thin region 8A, a permissible current value of bus bar 8 can be increased in above-described power semiconductor device 107.

In power semiconductor device 107, bus bar 8 is not limited to the configuration shown in FIG. 9, and may be configured as follows, for example. As shown in FIG. 10, bus bar 8 may be provided such that the sidewall surface of recessed portion 8C is orthogonal to the surface of thick region 8B arranged to face toward the opposite side of stress mitigation portion 6. In addition, as shown in FIG. 10, in addition to thin region 8A, a part of thick region 8B located on the thin region 8A side may be bonded to solder layer 7.

Figure 11:
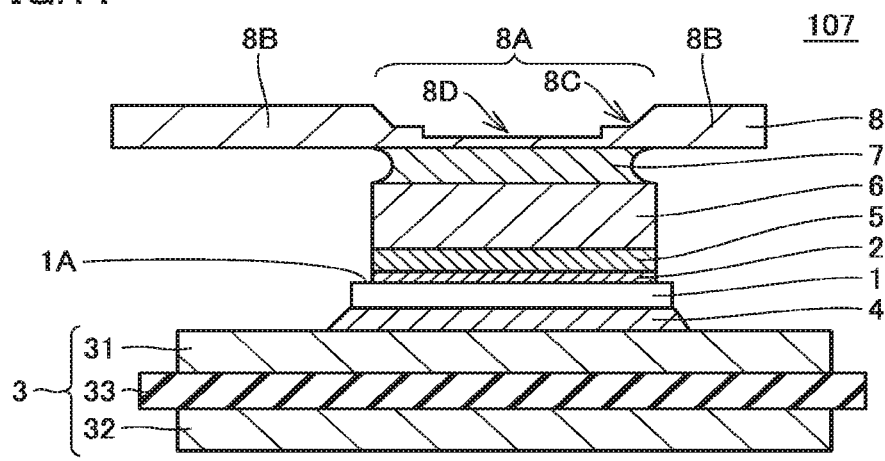
FIG. 11 is a cross-sectional view showing another modification of the power semiconductor device according to the tenth embodiment.

As shown in FIG. 11, bus bar 8 may be further provided with a recessed portion 8D that is recessed with respect to the bottom surface of recessed portion 8C. A sidewall surface of recessed portion 8D is, for example, provided to be orthogonal to the bottom surface of recessed portion 8C. The sidewall surface of recessed portion 8D may, for example, be provided to be tapered to form an obtuse angle with respect to the bottom surface of recessed portion 8C. Bus bar 8 may have a staircase shape formed of two or more recessed portions.

Figure 12:
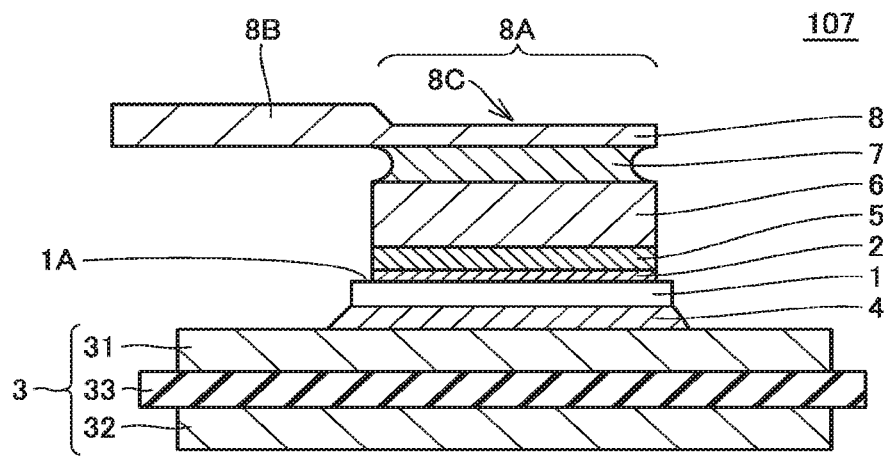
FIG. 12 is a cross-sectional view showing still another modification of the power semiconductor device according to the tenth embodiment.
Figure 13:
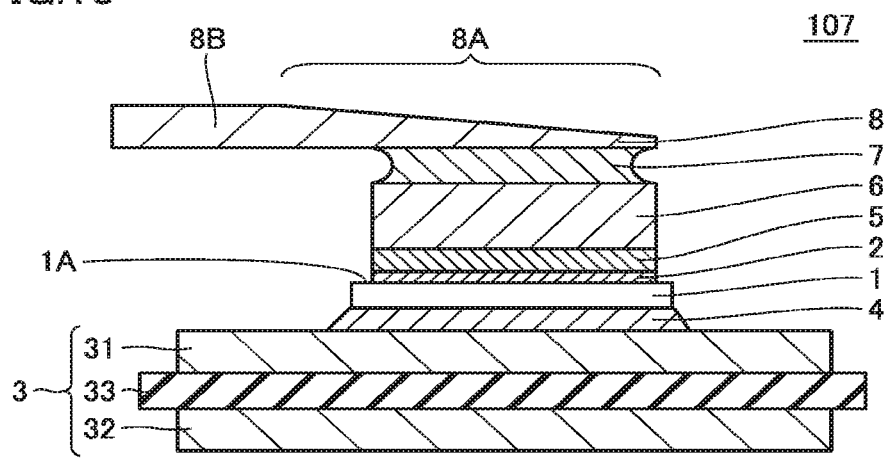
FIG. 13 is a cross-sectional view showing a further modification of the power semiconductor device according to the tenth embodiment.

As shown in FIGS. 12 and 13, above-described thin region 8A may be provided at one end in the direction of extension of bus bar 8. Above-described thick region 8B may be provided only on one side with respect to above-described thin region 8A in the direction of extension of bus bar 8. As shown in FIG. 13, thin region 8A may be provided such that the thickness thereof becomes gradually greater from one end of thin region 8A forming one end of bus bar 8 to the other end of above-described thin region 8A in contact with thick region 8B, in the direction of extension of bus bar 8. In addition, as shown in FIG. 13, only a relatively thin portion of thin region 8A may be bonded to solder layer 7.

Figure 14:
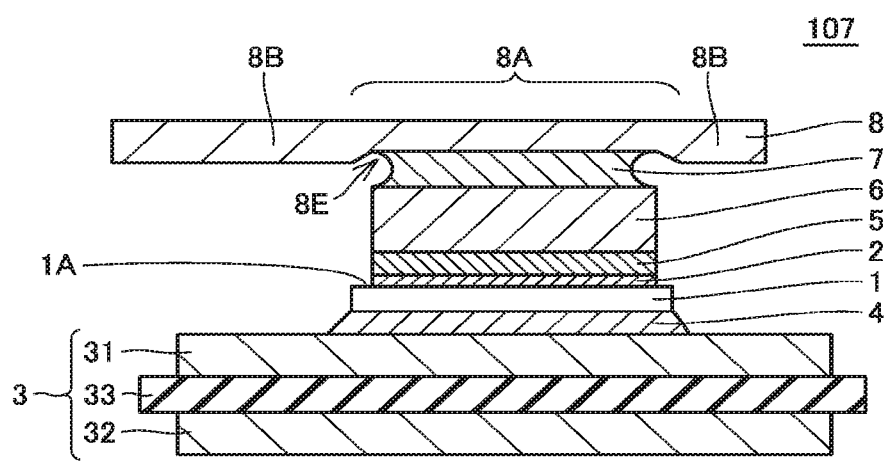
FIG. 14 is a cross-sectional view showing a further modification of the power semiconductor device according to the tenth embodiment.

Although the surfaces of thin region 8A and thick region 8B arranged to face toward the stress mitigation portion 6 side are provided to form the same plane in power semiconductor device 107 shown in FIGS. 9 to 13, the present invention is not limited thereto. Power semiconductor device 107 may, for example, have a configuration obtained by turning upside down each bus bar 8 shown in FIGS. 9 to 13. As shown in FIG. 14, for example, bus bar 8 may be provided with a recessed portion 8E that is recessed with respect to the surface arranged to face the stress mitigation portion 6 side. In this case, only a bottom surface of recessed portion 8E may be bonded to solder layer 7, or the bottom surface and a sidewall surface of recessed portion 8E may be bonded to solder layer 7.

Figure 15:
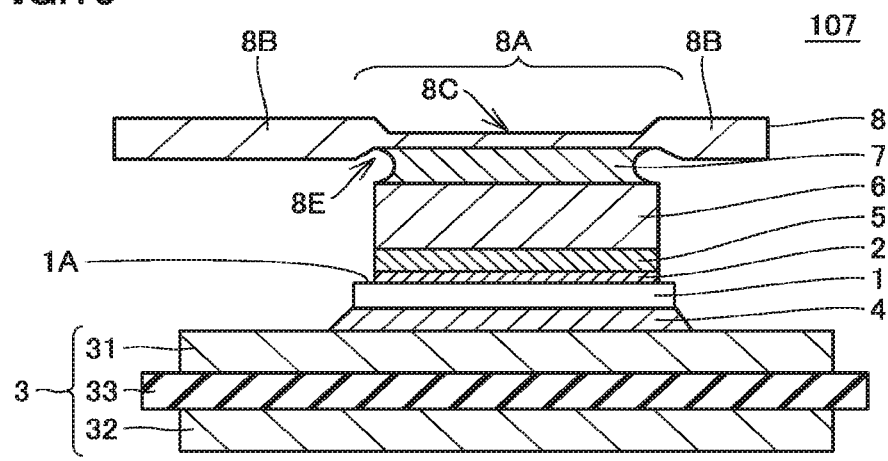
FIG. 15 is a cross-sectional view showing a further modification of the power semiconductor device according to the tenth embodiment.

In addition, power semiconductor device 107 may, for example, have a configuration of a combination of any one of bus bars 8 shown in FIGS. 9 to 13 and a configuration obtained by turning upside down any one of bus bars 8 shown in FIGS. 9 to 13. As shown in FIG. 15, for example, above-described recessed portion 8C and above-described recessed portion 8E are provided to overlap with each other when first surface 1A is seen in a plan view. Thin region 8A is arranged, for example, between the bottom and sidewall surfaces of above-described recessed portion 8C and the bottom and sidewall surfaces of above-described recessed portion 8E.

Bus bar 8 shown in FIGS. 9 to 15 can be formed by performing arbitrary processing such as pressing, etching or cutting on a portion that will form thin region 8A in a plate-like member that will form bus bar 8.

Figure 9:
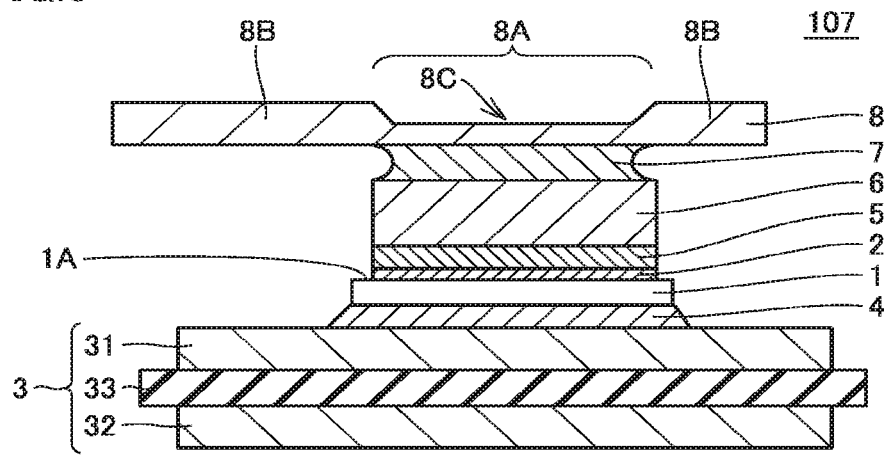
FIG. 9 is a cross-sectional view showing a power semiconductor device according to a tenth embodiment.
Figure 10:
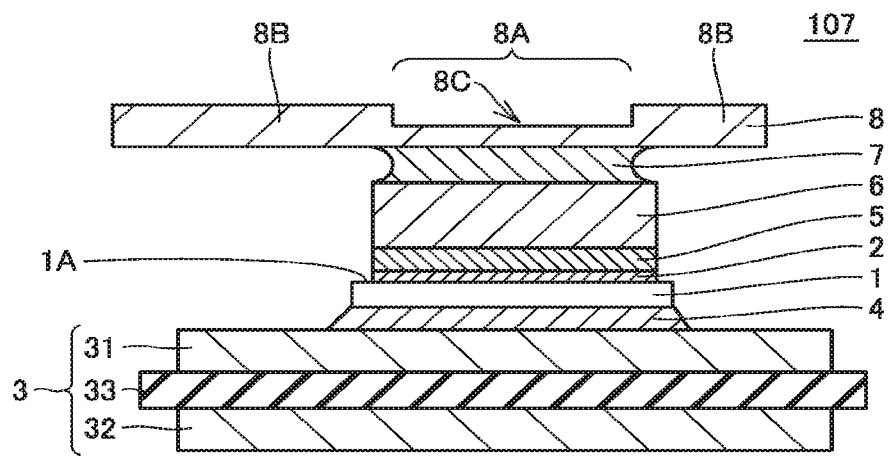
FIG. 10 is a cross-sectional view showing a modification of the power semiconductor device according to the tenth embodiment.

Since each of power semiconductor devices 107 shown in FIGS. 10 to 15 is also configured basically similarly to power semiconductor device 107 shown in FIG. 9, each of power semiconductor devices 107 shown in FIGS. 10 to 15 can produce an effect similar to that of power semiconductor device 107 shown in FIG. 9.

Although above-described thin region 8A shown in FIGS. 9 to 15 is provided to extend between opposing ends of bus bar 8 in the direction along first surface 1A and intersecting with the direction of extension of bus bar 8 (direction perpendicular to the sheets of FIGS. 9 to 15), the present invention is not limited thereto. When only a part of bus bar 8 is provided to be in contact with solder layer 7 in the above-described intersecting direction, only a part of bus bar 8 may be configured as thin region 8A in the above-described intersecting direction. When the region of bus bar 8 in contact with solder layer 7 is arranged on more inner side than the opposing ends of bus bar 8 in the above-described intersecting direction, thick region 8B is, for example, provided to surround thin region 8A. Since such power semiconductor device 107 is also configured basically similarly to power semiconductor device 107 shown in FIG.

9, power semiconductor device 107 can produce an effect similar to that of power semiconductor device 107 shown in FIG. 9.

Figure 16:
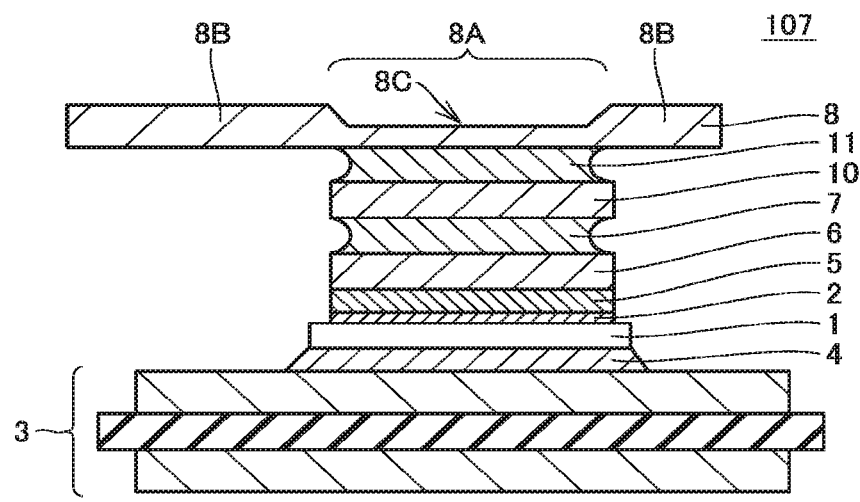
FIG. 16 is a cross-sectional view showing a further modification of the power semiconductor device according to the tenth embodiment.

In addition, as shown in FIG. 16, power semiconductor device 107 may further include second stress mitigation portion 10 in addition to stress mitigation portion 6 (first stress mitigation portion), similarly to power semiconductor device 102 according to the fifth embodiment. Thin region 8A is at least a part of a region of bus bar 8 in contact with solder layer 11 serving as a third bonding portion. Such power semiconductor device 107 can also produce an effect similar to that of above-described power semiconductor device 107.

Eleventh Embodiment

Next, a power semiconductor device according to an eleventh embodiment will be described. The power semiconductor device according to the eleventh embodiment is configured basically similarly to power semiconductor device 100 according to the first embodiment. However, the power semiconductor device according to the eleventh embodiment is different from power semiconductor device 100 according to the first embodiment in that the second bonding portion is a composite layer formed of a sintered metal and a resin, instead of the solder layer.

A material for the composite layer is a sintered metal and a resin. The material for the composite layer includes, for example, at least one of silver (Ag) and Cu, and an epoxy resin. From a different perspective, the composite layer is different from sintered metal layer 5 in that the composite layer includes a resin. As described above, sintered metal layer 5 is a sintered layer obtained by heating and pressurizing a paste-like kneaded material in which a metal powder is dispersed in a resin. In contrast, the composite layer is a composite layer of a sintered metal and a resin obtained by heating a paste-like kneaded material in which a metal powder is dispersed in a resin. The composite layer can be formed by sintering the above-described paste-like kneaded material without being pressurized. A sintered density of the composite layer is lower than a sintered density of sintered metal layer 5. In the composite layer, a space (gap) between the sintered metals is filled with the resin. Therefore, a porosity of the composite layer is lower than a porosity of sintered metal layer 5.

In the power semiconductor device according to the eleventh embodiment as well, the hardness, the shear strength and the yield strength of sintered metal layer 5 is higher than the hardness, the shear strength and the yield strength of solder layer 7 when the temperature of power semiconductor element 1 is a certain temperature within the temperature range of not lower than 175° C. and not higher than 230° C. (first temperature range), similarly to power semiconductor device 100. As a result, the power semiconductor device according to the eleventh embodiment can produce an effect similar to that of power semiconductor device 100 according to the first embodiment.

Although an IGBT is described as one example of power semiconductor element 1 in power semiconductor devices 100 to 107 according to the first to eleventh embodiments, the present invention is not limited thereto. In addition, the semiconductor material of power semiconductor element 1 is not particularly limited. On the other hand, in power semiconductor devices 100 to 107, as a hardness of the semiconductor material of power semiconductor element 1 becomes higher, a thermal stress applied to the bonding portion between electrode 2 of power semiconductor element 1 and stress mitigation portion 6 becomes greater. Therefore, power semiconductor devices 100 to 107 are particularly suitable for a power semiconductor device including a power semiconductor element that contains, as a semiconductor material, silicon carbide (SiC) higher in hardness than Si.

As described above, stress mitigation portion 6 in power semiconductor devices 100 to 107 according to the first to eleventh embodiments can be configured as a cladding material. FIG. 17 is a partial cross-sectional view showing such stress mitigation portion 6. As shown in FIG. 17, stress mitigation portion 6 may be configured, for example, as a stacked body formed of invar 62 (second layer), a first Cu layer 61 (first layer) formed on one side of invar 62, and a second Cu layer 63 (third layer) formed to sandwich invar 62 between first Cu layer 61 and second Cu layer 63.

Although power semiconductor devices 100 to 107 according to the first to eleventh embodiments include insulating substrate 3, the present invention is not limited thereto. Power semiconductor devices 100 to 107 may include at least power semiconductor element 1, stress mitigation portion 6 (first stress mitigation portion) connected to electrode 2 of power semiconductor element 1 with the first bonding portion being interposed, and bus bar 8 (wiring portion) connected to stress mitigation portion 6 with the second bonding portion being interposed.

While the embodiments of the present invention have been described above, the above-described embodiments can also be variously modified. It is also originally intended to combine the features of the above-described embodiments as appropriate. For example, the features of the fifth to tenth embodiments may be combined not only with the features of the first embodiment but also with the features of any one of the second to fourth embodiments and the eleventh embodiment. The scope of the present invention is not limited to the above-described embodiments. The scope of the present invention is defined by the terms of the claims, and is intended to include any modifications within the scope and meaning equivalent to the terms of the claims.

INDUSTRIAL APPLICABILITY

The present invention is particularly advantageously applied to a power semiconductor device used in power electronics equipment such as inverters for electric vehicles and hybrid vehicles and inverters for railway vehicles.

REFERENCE SIGNS LIST 1 power semiconductor element; 1A first surface; 2 electrode; 3 insulating substrate; 4 die bonding material; 5 sintered metal layer (first bonding portion); 5A, 5B, 5C, 5D portion; 6 stress mitigation portion (first stress mitigation portion); 7 solder layer (second bonding portion); 8 bus bar (wiring portion); 8A thin region; 8B thick region; 8C, 8D, 8E recessed portion; 9 interface (first bonding portion); 10 second stress mitigation portion; 11 solder layer (third bonding portion); 100, 101, 102, 103, 104, 105, 106, 107 power semiconductor device.

The invention claimed is:
1. A power semiconductor device comprising:
a power semiconductor element having a first surface and including an electrode formed on the first surface;
a first stress mitigation portion connected to the electrode with a first bonding portion being interposed; and a wiring portion connected to the first stress mitigation portion with a second bonding portion being interposed, a bonding strength of the first bonding portion being higher than a bonding strength of the second bonding portion, the wiring portion having a thin region and a thick region, one side surface of the thin region and one side surface of the thick region being the same plane, another side surface of the thin region being recessed with respect to another side surface of the thick region, and the one side surface of the thin region or the another side surface of the thin region contacting with the second bonding portion.

2. The power semiconductor device according to claim 1, wherein the first bonding portion is a bonding layer bonded to the electrode and the first stress mitigation portion, and as to at least one of hardness, shear strength and yield strength when a temperature of the power semiconductor element is a certain temperature within a temperature range of not lower than 175° C. and not higher than 230° C., a value of the first bonding portion is higher than a value of the second bonding portion.

3. The power semiconductor device according to claim 2, wherein the first bonding portion is a sintered metal layer, and the second bonding portion is a solder layer.

4. The power semiconductor device according to claim 2, wherein the first bonding portion is a first sintered metal layer, and the second bonding portion is a second sintered metal layer, and a porosity of the first sintered metal layer is lower than a porosity of the second sintered metal layer.

5. The power semiconductor device according to claim 2, wherein the first bonding portion is a liquid phase diffusion bonding layer.

6. The power semiconductor device according to claim 2, wherein the first bonding portion is a sintered metal layer, and a material for the second bonding portion includes a sintered metal and a resin.

7. The power semiconductor device according to claim 1, wherein the first bonding portion is an interface at which the electrode and the first stress mitigation portion are directly bonded, and as to at least one of hardness, shear strength and yield strength when a temperature of the power semiconductor element is a certain temperature within a temperature range of not lower than 175° C. and not higher than 230° C., a value of the first bonding portion is higher than a value of the second bonding portion.

8. The power semiconductor device according to claim 1, wherein a thermal expansion coefficient of the first stress mitigation portion is between a thermal expansion coefficient of the power semiconductor element and a thermal expansion coefficient of the wiring portion.

9. The power semiconductor device according to claim 8, wherein a material for the electrode includes copper, a material for the wiring portion includes copper, the first stress mitigation portion includes a first layer, a second layer and a third layer stacked sequentially, a material for the first layer and the third layer includes copper, and a material for the second layer includes nickel and iron.

10. The power semiconductor device according to claim 1, further comprising a second stress mitigation portion connected to the first stress mitigation portion with the second bonding portion being interposed, and connected to the wiring portion with a third bonding portion being interposed, wherein the wiring portion is connected to the first stress mitigation portion with the second bonding portion, the second stress mitigation portion and the third bonding portion being interposed.

11. The power semiconductor device according to claim 1, wherein a material for the electrode includes copper.

12. The power semiconductor device according to claim 1, wherein a corner of an outer shape of the first bonding portion has a curved shape when the first surface is seen in a plan view.

13. The power semiconductor device according to claim 1, wherein the first bonding portion includes a plurality of portions arranged in a dispersed manner when the first surface is seen in a plan view.

14. The power semiconductor device according to claim 1, wherein the first stress mitigation portion has a second surface connected to the first bonding portion, and a third surface located on an opposite side of the second surface and connected to the second bonding portion, and an area of the third surface is larger than an area of the second surface.

* * * * *